United States Patent [19]
Matsuyama et al.

[11] Patent Number: 5,242,852
[45] Date of Patent: Sep. 7, 1993

[54] METHOD FOR MANUFACTURING A SEMICONDUCTOR MEMORY DEVICE

[75] Inventors: Kazuhiro Matsuyama; Masanori Fukumoto; Yasushi Naito; Hisashi Ogawa, all of Osaka; Shozo Okada, Hyogo, all of Japan

[73] Assignee: Matsushita Electric Industrial Co. Ltd., Osaka, Japan

[21] Appl. No.: 944,883

[22] Filed: Sep. 11, 1992

Related U.S. Application Data

[63] Continuation-in-part of Ser. No. 739,858, Aug. 2, 1991, abandoned.

[30] Foreign Application Priority Data

Aug. 3, 1990 [JP] Japan ................ 2-207442
Sep. 13, 1991 [JP] Japan ................ 3-234588

[51] Int. Cl.$^5$ .............................. H01L 21/70
[52] U.S. Cl. ......................... 437/52; 437/47; 437/48; 437/60; 437/228; 437/919
[58] Field of Search ............ 437/47, 48, 52, 60, 437/228, 235, 919; 257/306

[56] References Cited

U.S. PATENT DOCUMENTS

4,956,204  9/1990  Amazawa et al. ............ 427/248.1
5,087,591  2/1992  Teng .................... 437/225

FOREIGN PATENT DOCUMENTS

59-155128  9/1984  Japan .
62-219512  9/1987  Japan .
62-286270 12/1987  Japan .
1-100960   4/1989  Japan .
1-208831   8/1989  Japan .
1-293615  11/1989  Japan .
1-298758  12/1989  Japan .
0094558    4/1990  Japan ................ 437/52
0137363    5/1990  Japan ................ 437/52

*Primary Examiner*—Tom Thomas
*Attorney, Agent, or Firm*—Willian Brinks Olds Hofer Gilson & Lione

[57] ABSTRACT

In a method for manufacturing DRAMs in a stacked memory cell type, an edge portion of each bit line is bared upon etching a first insulating film, the bared edge portion is etched to from an opening and an inner peripheral surface of the opening is covered by a second insulating film. There is also disclosed a method wherein second and third insulating films and second conductive film are stacked on a first insulating film, a second conductive film is formed and the second conductive film and the first conductive film are partially etched whereby the unetched portions of the first conductive film serve as electrode planes of charge storage electrodes.

5 Claims, 5 Drawing Sheets

METHOD FOR MANUFACTURING A SEMICONDUCTOR MEMORY DEVICE

CROSS-REFERENCE TO RELATED APPLICATIONS

This application is a continuation-in-part application of U.S. patent application Ser. No. 07/739,858, filed Aug. 2, 1991, entitled "A METHOD FOR MANUFACTURING A SEMICONDUCTOR MEMORY DEVICE", now abandoned.

BACKGROUND OF THE INVENTION

1. Field of the Invention

The present invention relates to a method for manufacturing a semiconductor memory device and, more particularly, to a method for manufacturing a DRAM memory cell of a stack type having a memory capacitance layer formed over a switching transistor.

2. Description of the Prior Art

A memory cell for a high density dynamic RAM has been realized by a so called "one transistor and one capacitor" memory cell which comprises one transistor and one memory capacitance. Since this memory cell is characterized by a small number of constructing parts and the cell area thereof can be easily miniaturized, this type of memory cell has been widely used. To accomplish the requirement for making the memory cell smaller, a memory cell of a stack type in which a memory capacitance is formed over a switching transistor is expected to be one of the major cells to be further developed.

FIG. 2 is a top plan view of a semiconductor memory device. FIGS. 4 and 5 are cross-sectional views taken along a line A—A shown in FIG. 2, respectively, and particularly illustrate the prior art manufacturing steps of the device.

A prior art method of a first type is disclosed in Japanese Patent application Ser. No. Hei 2-207442 and is explained with reference of FIGS. 2 and 4.

In FIGS. 2 and 4, an active region 21 of a switching transistor is isolated electrically by a silicon oxide film 22. On this active region 21, a word line 20, a bit line 6, an electric charge storage electrode 9, a capacitance insulating film 10 and a plate electrode 11 are formed sequentially thereon in this order. The active region 21 is connected electrically to the bit line 6 through a bit line contact 22 and to the electric charge storage electrode 9 through an electric charge storage electrode contact 23, respectively.

Referring to FIG. 4(a), the silicon oxide film 2 is formed on a P-type semiconductor substrate 1 by a LOCOS method. After that, the switching transistor and the bit line 6 are formed in accordance with the known method. A reference numeral 7 designates an n+ type diffusion layer acting as a source/drain of the switching transistor and a reference numeral 3 designates a first insulating film.

In this process, the bit line is apt to be bared by misalignment of the mask in the lithography process as the device is miniaturized more and more. To avoid this problem, after covering the opening 13 by a second insulating film 8, as shown in FIG. 4(b), the electric charge storage electrode 9 is formed, as shown in FIG. 4(c).

Next, a second prior art method is explained with reference to FIG. 5. There have been proposed some structures which utilize bottom surfaces of respective charge storage electrodes for electrode surfaces in order to obtain a reasonable capacitance while miniaturizing devices. As an example of such structures, there has been a method in which a part of a first insulating film 3 is removed by wet etching with use of a solvent of hydrofluoric acid and, thereby, a space is maintained between the first insulating film 3 and a charge storage electrode 9.

As shown in FIG. 5(a), after depositing a silicon nitride film as a second insulating film 8 and a silicon oxide film as a third insulating film 31 on the first insulating film successively, the third, second and first insulating films 31, 8 and 3 are removed by anisotropy etching using a resist pattern 17 as a mask to form an opening 13. Next, as shown in FIG. 5(b), side walls are formed by a fourth insulating film to guarantee insulation between a bit line 6 and an electric charge storage electrode to be formed later. Thereafter, after depositing polycrystalline silicon as a first conductive film 32, as shown in FIG. 5(c), a patterning for forming the electric charge storage electrodes is carried out, as shown in FIG. 5(d). Then, the silicon oxide film as the third insulating film 31 is removed using a solvent of hydrofluoric acid to form a space 14 between the bottom surface of the charge storage electrode 9 and the second insulating film 8 and, by utilizing the surface of the charge storage electrode bared by the space 14 as an electrode, a reasonable capacitance can be obtained.

However, the conventional methods as stated above have problems as follows.

At first, in the first prior art method, if a width of an bared portion of the bit line 6 is larger than the thickness of the second insulating film 8, that portion is not covered completely by the second insulating film 8 and, accordingly, the bit line 6 is short circuited to the electric charge storage electrode 9 through an uncovered portion 15 of the bit line 6 as indicated by a reference numeral 16 in FIG. 4(c).

In the second prior art method, there is such a possibility that the first insulating film 3 may be etched through the side wall as the fourth insulating film 33 upon wet-etching the same and, thereby, the bit line 6 can be bared again, as shown in (e) of FIG. 5. When the capacitor insulating film and plate electrode are formed as usual, the stability of the device is lowered due to an increase of the capacitance between the bit line and the plate electrode.

SUMMARY OF THE INVENTION

An object of the present invention is to provide a method for manufacturing a semiconductor memory device capable of maintaining the electrical insulating ability between a bit line and an electric charge storage electrode even when a bit line is bared due to the incorrect position of an opening caused by a mismatching lithography process.

Another object of the present invention is to provide a method for manufacturing semiconductor memory devices of such a type as mentioned regarding the second prior art method capable of preventing a first insulating film from etching through a side wall consisting of an insulating film.

In order to achieve these objects, according to the present invention, there is provided a method for manufacturing semiconductor memory devices in a DRAM type in which switching transistors, bit lines and memory capacitors are formed stacked on a semiconductor substrate being characterized by steps of etching a first insulating film covering said bit lines so that each of said bit lines is bared partially, etching bare portions of said bit lines, forming openings by etching said first insulating film, depositing a second insulating film so as to cover surfaces defining said openings, and etching back said second insulating film by at least a thickness equivalent to that deposited as said second insulating film by an anisotropic etching so as to leave side wall portions covering inner peripheral surfaces of said openings.

According to another facet of the present invention, there is provided a method for manufacturing semiconductor memory devices in a DRAM type in which switching transistors, bit lines and memory capacitors are formed stacked on a semiconductor substrate being characterized by steps of depositing second and third insulating films and a first electrically conductive film on a third insulating film covering said bit lines, etching said first conductive film, etching said third, second and first insulating films to form openings, depositing a fourth insulating film to cover inner surfaces of each opening, etching back said fourth insulating film by an anisotropic etching so as to bare at least a part of the cross-section of said first insulating film while covering the cross-section of each of said bit lines, depositing a second electrically conductive film to connect a diffusion layer of said switching transistor and said first conductive film electrically, forming electric charge storage electrodes at said openings, and etching said third insulating film under an etching condition in which an etching rate for said third insulating film is larger than those for said first and second conductive films and said second insulating film.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENT

First Embodiment

FIG. 1 shows steps for manufacturing a semiconductor memory device according to the first preferred embodiment of the present invention.

Figure 1A:
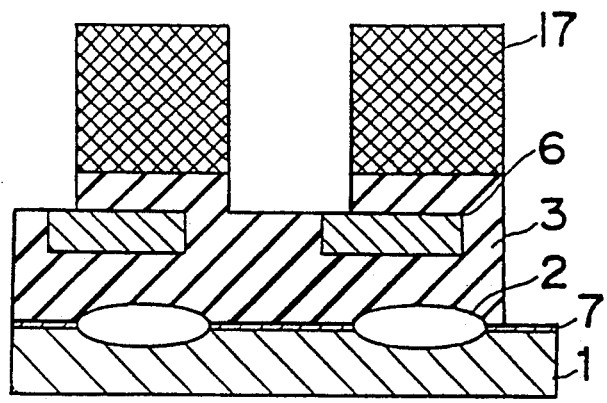
FIGS. 1(a), 1(b), 1(c) and 1(d) are cross-sectional views along A—A line in FIG. 2 which show main manufacturing steps according to a first preferred embodiment of the present invention, respectively.

In a step shown in FIG. 1(a), $SiO_2$ films 22 are formed on a P-type semiconductor substrate 1 by a LOCOS method at first. Then, switching transistors and bit lines 6 are formed using a method known to those skilled in the art. A reference numeral 7 denotes a source/drain of the switching transistor and 3 denotes a first insulating film in which each bit line 6 is embedded.

Thereafter, the first insulating film 3 is anisotropically etched using a resist pattern 17 as a mask until an edge portion of each bit line 6 is bared partially.

In FIG. 1(a), there is shown a case in that the bit line 6 is bared by 200 nm due to a mismatching in a lithography process.

Figure 1B:
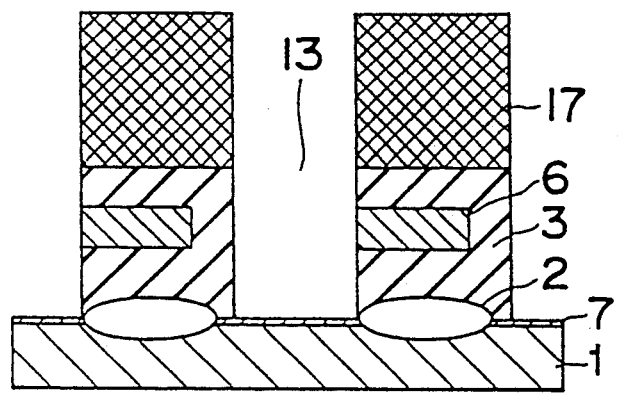

In a step shown in FIG. 1(b), after removing the bared portion of each bit line 6 by an etching while maintaining the resist pattern as it is, the remaining first insulating film 3 is removed by an etching so as to form openings 13 each defining a vertical hole with a bottom formed by the diffusion layer 7.

Figure 1C:
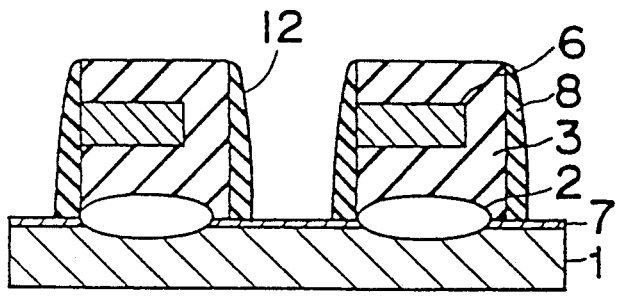

In a step shown in FIG. 1(c), after removing the resist pattern 17, a second insulating film 8 made of silicon oxide is deposited by a thickness of 150 nm using a high temperature CVD method.

Then, the second insulating film 8 is etched back by an over-etching of 30% of a thickness thereof to form side walls 12 which cover inner peripheral surfaces of the openings 13.

Figure 1D:
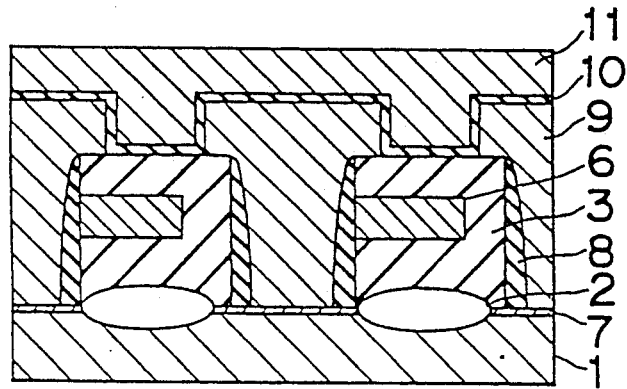
Figure 2:
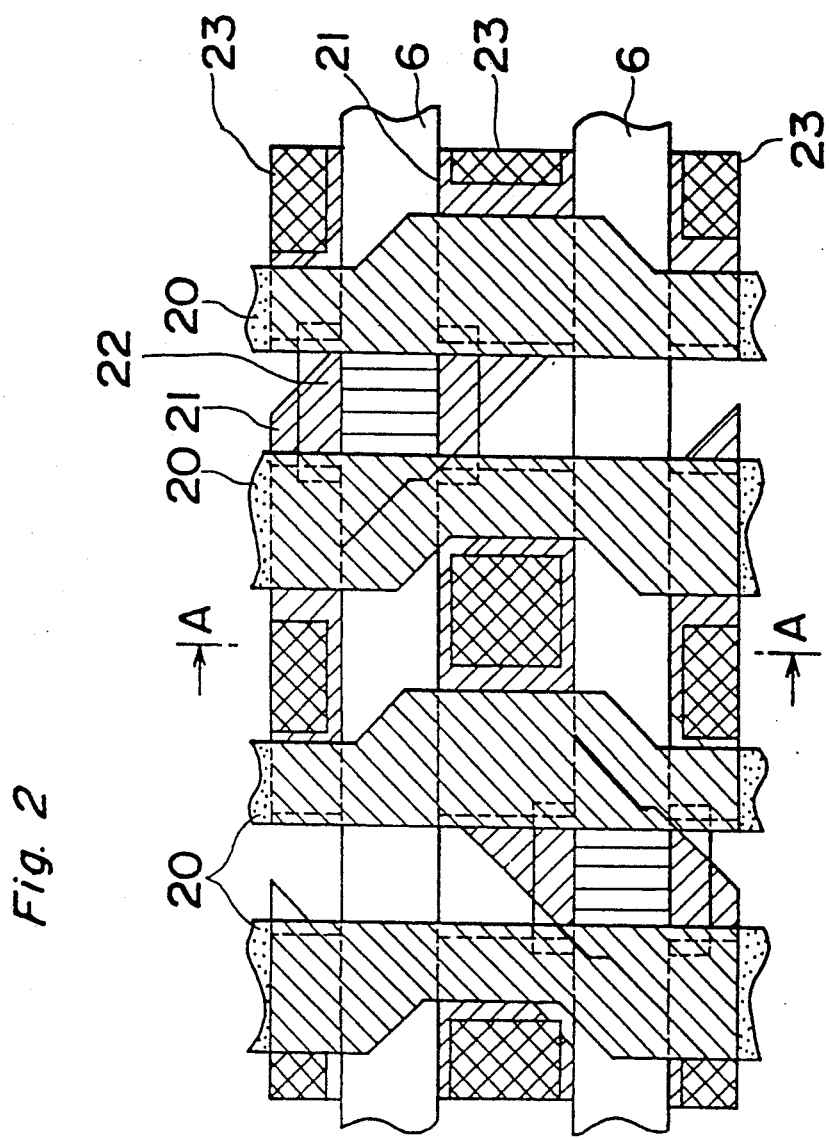
FIG. 2 is a plan view for showing a structure of the semiconductor memory device according to the first preferred embodiment.

In a step shown in FIG. 1(d), electric charge storage electrodes 9 made of polycrystalline silicon, capacitor insulating film 10 made of nitride oxide silicon and plate electrode 11 made of polycrystalline silicon are formed in this order and, thereby, memory capacitors are formed.

As stated above, according to the first preferred embodiment, the bit line 6 is surely insulated from the electric charge storage electrode 9 by etching the bared portions of the bit lines and forming insulating side walls on the inner peripheral surfaces of the openings.

In the first preferred embodiment, an etching apparatus with multi chambers is used for etching the first insulating film 3 and the bit lines 6, respectively. The first insulating film 3 is etched by a reactive ion etching use of $CH_2F_2/CF_4$ gas and the bit lines are etched by a reactive ion etching with use of $HCl/HBr/SF_6/O_2$ by a three stage etching without exposing the wafer to the air.

The three stage etching can be made in an etching chamber by changing processing conditions.

Second Embodiment

Figure 3A:
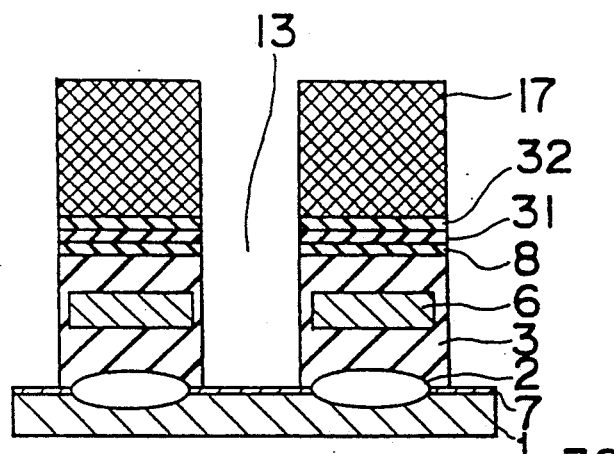
FIGS. 3(a), 3(b), 3(c), 3(d) and 3(e) are cross-sectional views along A—A line in FIG. 2 which show main manufacturing steps according to a second preferred embodiment of the present invention, respectively.
Figure 3B:
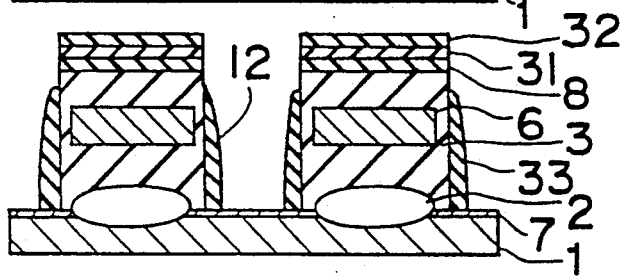
Figure 3C:
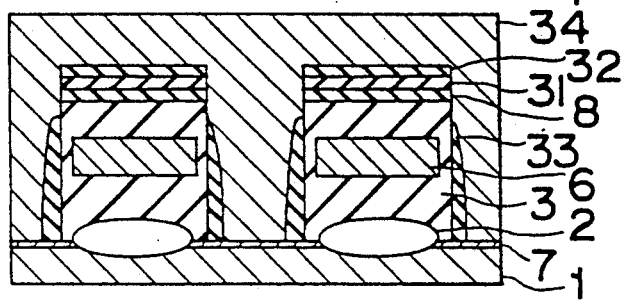
Figure 3D:
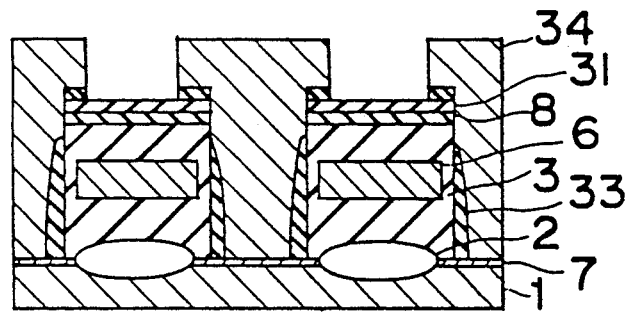
Figure 3E:
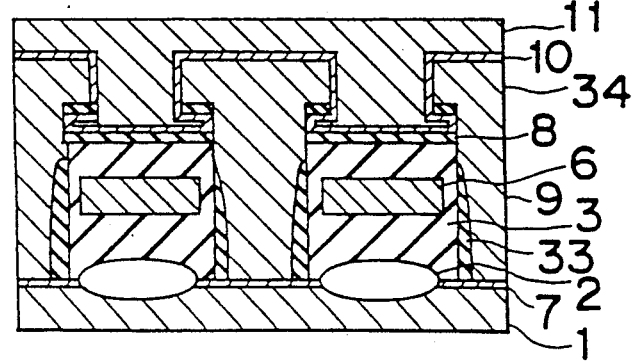
Figure 4A:
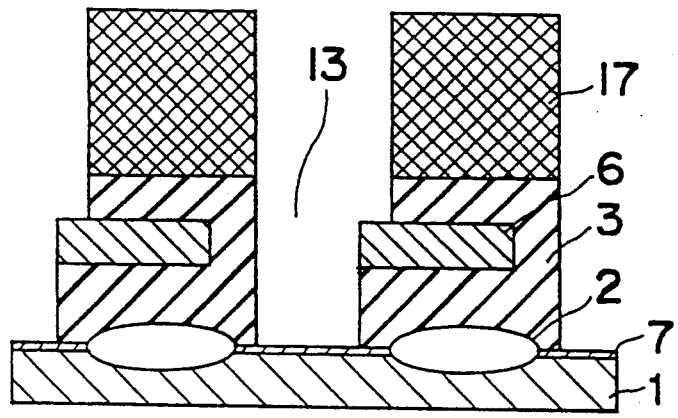
FIGS. 4(a), 4(b) and 4(c) are cross-sectional views showing main manufacturing steps in a first prior art method, respectively.
Figure 4B:
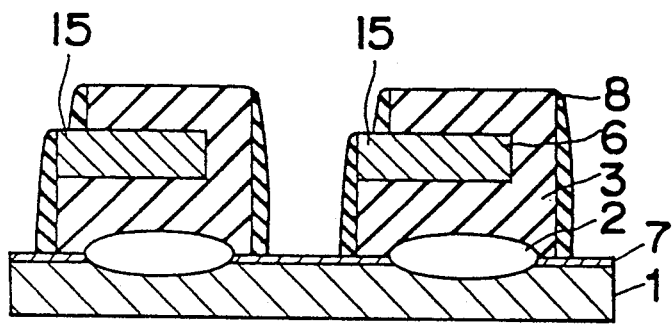
Figure 4C:
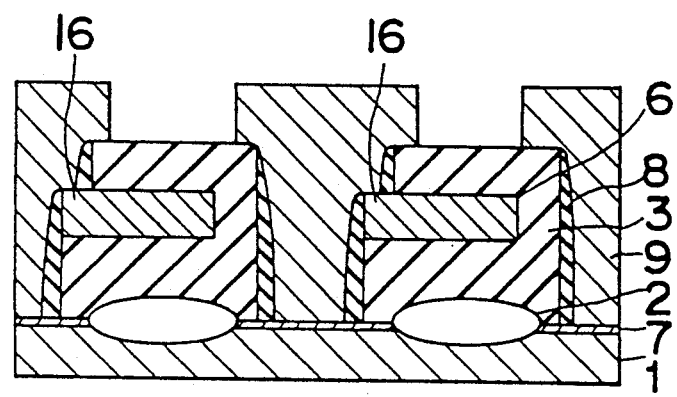
Figure 5A:
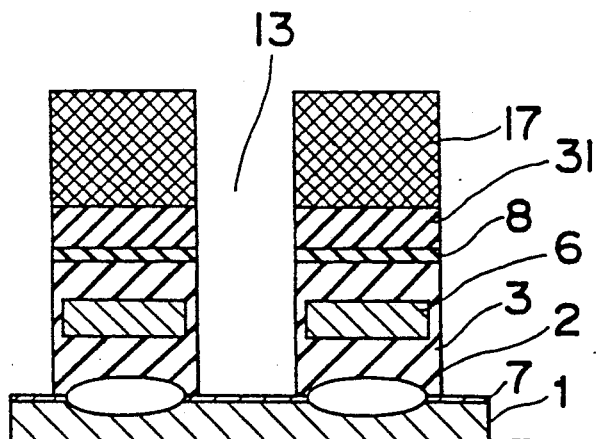
FIGS. 5(a), 5(b), 5(c), 5(d) and 5(e) are cross-sectional views showing main manufacturing steps in a second prior art method, respectively.
Figure 5B:
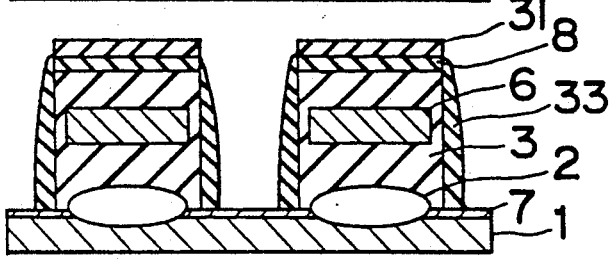
Figure 5C:
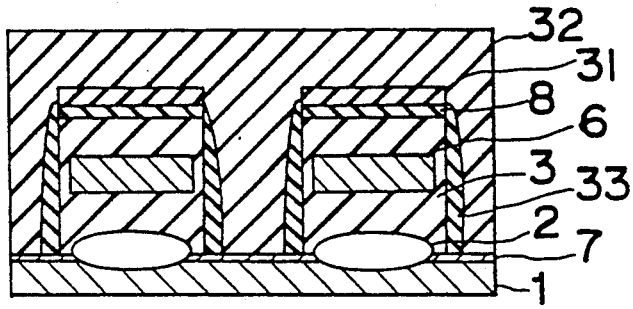
Figure 5D:
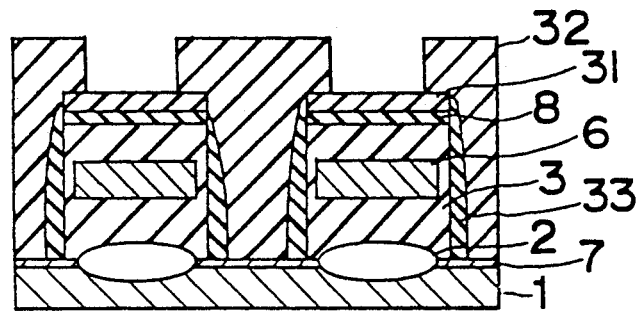
Figure 5E:
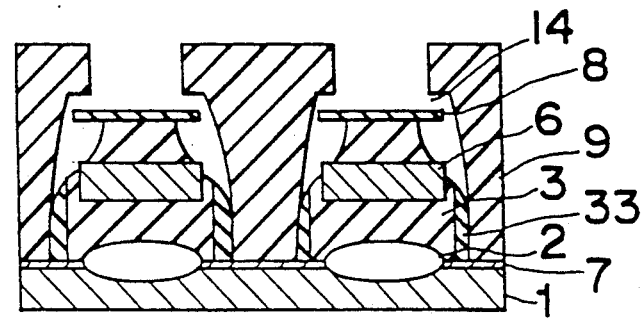

FIGS. 3(a) and 3(e) show a manufacturing method for semiconductor memory devices according to the second preferred embodiment of the present invention.

In a step shown in FIG. 3(a), $SiO_2$ films 2 are formed on a P-type semiconductor substrate 1 by a LOCOS method. Thereafter, switching transistors and bit lines 6 are formed using a method well known to those skilled in the art. A reference numeral 7 denotes an n+ diffusion layer forming a source/drain of the switching transistor, and 3 denotes a first insulating film in which the bit line 6 is embedded. Next, a silicon nitride film of 30 nm thickness as a second insulating film 8, an silicon oxide film of 30 nm thickness deposited by a high temperature CVD as a third insulating film 31 and n n+ polycrystalline silicon as a first conductive film 32 are deposited in succession and, then, a resist pattern 17 is formed on the first conductive film 32. Using the resist pattern 17 as a mask, the first conductive film 32 is etched by an anisotropic etching at first, and, then, the third, second and first insulating films 31, 8 and 3 are etched in succession to form openings 13 each forming a vertical hole with a bottom formed by the n+ diffusion layer 7.

In a step as shown in FIG. 3(b), after removing the resist pattern 17, a fourth insulating film 33 of silicon oxide is deposited by a thickness of 150 nm using a high temperature CVD method and, then anisotropically etched back until the third insulating film 32 is completely bared. By this etching back, insulating side walls 12 are left so as to cover inner peripheral surfaces defined by the openings 13.

In a step shown in FIG. 3(c), n+ polycrystalline silicon is deposited as a second conductive film 34 so that it is electrically connected to the n+ diffusion layer 7 and first conductive layer 32.

In a step shown in FIG. 3(d), the second and first conductive films 34 and 32 are etched to patternize an electric charge storage electrode.

In a step shown in FIG. 3(e), the third insulating film 31 is etched using a mixture solvent of hydrofluoric acid and ammonium fluoride and, then, a capacitor insulating film 10 made of nitride oxide silicon and a plate electrode 11 made of polycrystalline silicon are formed.

A memory capacitor is formed by the charge storage electrode 9, capacitor insulating film 10 and plate electrode 11.

Upon wet-etching, the charge storage electrode 9 and the second insulating film 8 made of nitride silicon are hardly etched and serve as an etching stopper. This enables the removal of only the third insulating film 31.

Since the cross section of the third insulating film at the opening 13, according to the second preferred embodiment, is completely covered by the second conductive film 34, the first insulating film 3 is never damaged in a later wet etching and, accordingly, a semiconductor memory device capable of utilizing the bottom surface of each electric charge storage electrode as an electrode plane is obtained. Also, since the first conductive film 32 serves as an etching stopper upon etching back the fourth insulating film 33, it becomes possible to prevent the interlayer insulating film from thinning.

Etching treatments for the third, second and first insulating films 31, 8 and 3, the first conductive film 32 and the bit line are performed in a multi-chamber type etching apparatus comprising plural chambers in which a reactive ion etching using $CH_2F_2/CF_4$ gas and that using $HCl/HBr/SF_6/O_2$ can be done, respectively, and the openings 13 are formed by a 4 stage etching without exposing wafers to the air.

However, the present invention is not restricted to the multi-chamber type etching apparatus and the four stage etching can be carried out by changing etching conditions in one chamber.

In the second preferred embodiment, the bit line 6 is assumed not to be bared upon forming openings 13 by etching. However, in the case that the bit line may be bared upon etching, the etching process for the bared bit line can be added to guarantee insulation between the bit line and the charge storage electrode as mentioned in the first preferred embodiment.

Further, though the charge storage electrode 9 is shown to have a simple configuration such as a column-like block in the preferred embodiment, the present invention is applicable to that having a complex three dimensional structure which is obtained, for example, by forming a multi-layered structure with silicon oxide and polycrystalline silicon and, thereafter, removing silicon oxide films.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for manufacturing semiconductor memory devices in a DRAM type in which switching transistors, bit lines and memory capacitors are formed stacked on a semiconductor substrate being characterized by steps of etching a first insulating film covering said bit lines so that each of said bit lines is bared partially, etching bared portions of said bit lines, forming openings by etching said first insulating film, depositing a second insulating film so as to cover surfaces defining said openings, and etching back said second insulating film by at least a thickness equivalent to that deposited as said second insulating film by an anisotropic etching so as to leave side wall portions covering inner peripheral surfaces of said openings.

2. The method as claimed in claim 1 wherein said etching steps for said first insulating film and said bit lines are performed by a multi-step etching of three steps using an etching apparatus of a multi-chamber type which comprises first and second chambers for etching an insulating film and bit lines, respectively.

3. A method for manufacturing semiconductor memory devices in a DRAM type in which switching transistors, bit lines and memory capacitors are formed stacked on a semiconductor substrate being characterized by steps of depositing second and third insulating films and a first electrically conductive film on a first insulating film covering said bit lines, etching said first conductive film, etching said third, second and first insulating films to form openings, depositing a fourth insulating film to cover inner surfaces of each opening, etching back said fourth insulating film by an anisotropic etching so as to bare at least a part of the cross-section of said first insulating film while covering the cross-section of each of said bit lines, depositing a second electrically conductive film to connect a diffusion layer of said switching transistor and said first conductive film electrically to form electric charge storage electrodes at said openings, and etching said third insulating film partially exposed through said charge storage electrode under an anisotropic etching condition in which an etching rate for said third insulating film is larger than those for said first and second conductive films and said second insulating film.

4. The method as claimed in claim 3 wherein the etching for said first conductive film and that for said third, second and first insulating films are carried out by a two step etching using an etching apparatus of a multi-chamber type which provides with an etching processing chamber for conductive films and that for insulating films.

5. The method as claimed in claim 3, wherein said first and second conductive films are made of polycrystalline silicon, said second insulating film is made of silicon nitride and said third insulating film is made of silicon oxide.

* * * * *